United States Patent [19]
Yoshimori

[11] Patent Number: 5,115,297
[45] Date of Patent: May 19, 1992

[54] COMPLEMENTARY TYPE SEMICONDUCTOR INTEGRATED CIRCUIT DEVICE

[75] Inventor: Masanori Yoshimori, Tokyo, Japan
[73] Assignee: NEC Corporation, Tokyo, Japan
[21] Appl. No.: 678,837
[22] Filed: Apr. 1, 1991
[30] Foreign Application Priority Data
  Mar. 30, 1990 [JP] Japan ................................... 2-83594
[51] Int. Cl.⁵ .................................................. H01L 27/02
[52] U.S. Cl. ........................................ 357/42; 357/51
[58] Field of Search ...................................... 357/42, 51
[56] References Cited
  U.S. PATENT DOCUMENTS
  4,868,627 9/1989 Yamada et al. ...................... 357/42

Primary Examiner—Mark Prenty
Attorney, Agent, or Firm—Helfgott & Karas

[57] ABSTRACT

A complementary type semiconductor integrated circuit device includes a semiconductor substrate of a first conductivity type connected to a high potential input terminal, a first well region and a second well region, both of a second conductivity type and formed selectively on a surface of the substrate. The well regions are connected to a high potential input terminal and a low potential input terminal, respectively. A diffusion region of the first conductivity type is formed selectively on a surface of the second well region. A capacitor having capacitance of a value larger than a capacitance between the high potential input terminal and the intermediate potential input terminal, whereby if the high and intermediate potentials are supplied to the high and intermediate input terminals and the low potential is not supplied to the low potential input terminal, it is possible to prevent electrons from flowing to the second well region from the diffusion region. Consequently, no latch-up occurs even when the low potential is supplied after the high potential and intermediate potentials have been supplied.

10 Claims, 2 Drawing Sheets

F I G. 1
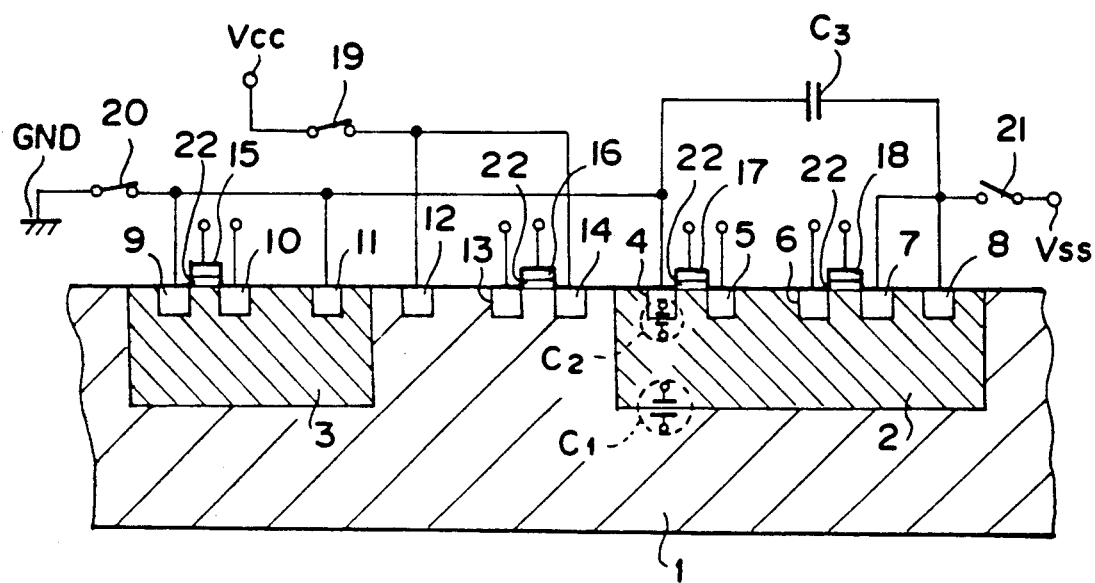
F I G. 2
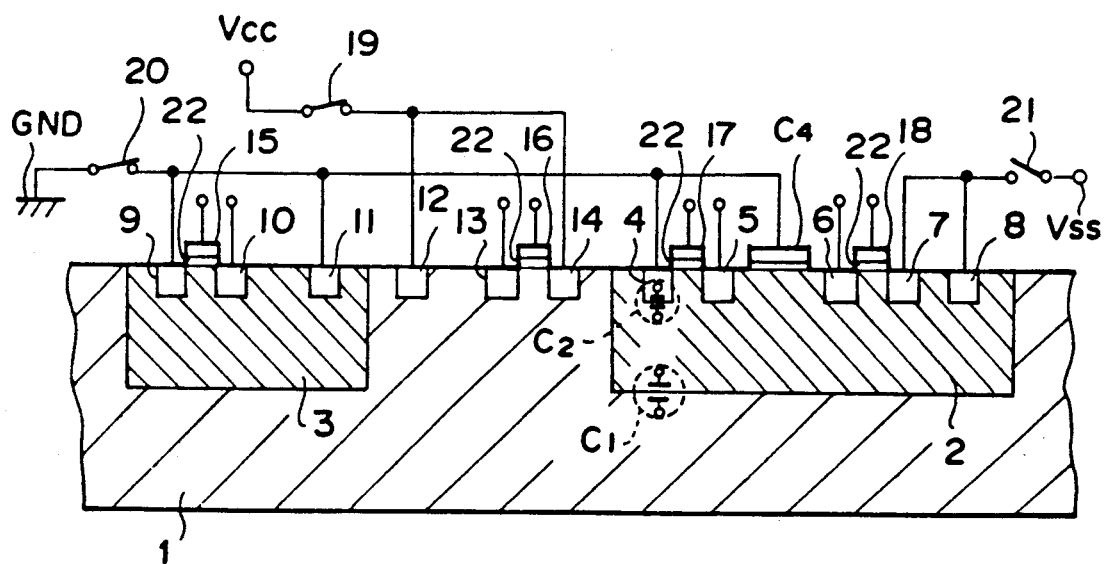

COMPLEMENTARY TYPE SEMICONDUCTOR INTEGRATED CIRCUIT DEVICE

BACKGROUND OF THE INVENTION

The present invention relates to a complementary type semiconductor integrated circuit device and, more particularly, to a complementary type semiconductor integrated circuit device having a protective circuit for preventing the occurrence of a latch-up.

Conventional complementary and P-well type semiconductor integrated circuit devices of the kind to which the present invention relates will fully be explained later. A common problem in such conventional integrated circuit devices is a latch-up which is caused by an external noise or, where there are different kinds of potentials, by a sequence in which such potentials are supplied.

SUMMARY OF THE INVENTION

It is, therefore, an object of the present invention to overcome the latch-up and other problems existing in the conventional complementary type semiconductor integrated circuit device and to provide an improved integrated circuit device.

According to one aspect of the invention, there is provided a complementary type semiconductor integrated circuit device adapted to be connected to a high potential input terminal, a low potential input terminal and an intermediate potential input terminal, the circuit device comprises:

a semiconductor substrate of a first conductivity type connected to the high potential input terminal;

a first well region of a second conductivity type formed selectively on a surface of the semiconductor substrate and connected to the high potential input terminal;

a second well region of the second conductivity type formed selectively on a surface of the semiconductor substrate and connected to the low potential input terminal;

a diffusion region of the first conductivity type formed selectively on a surface of the second well and connected to the intermediate potential input terminal; and a capacitor interconnecting the intermediate potential input terminal and the low potential input terminal, the capacitance of the capacitor being of a value larger than that existing between the high potential input terminal and said intermediate potential input terminal.

In view of the above arrangement, where the high potential and the intermediate potential are supplied to the high potential input terminal and the intermediate input terminal and the low potential is not supplied to the low potential input terminal, it is possible to prevent electrons from flowing to the second well region from the diffusion region. Consequently, no latch-up occurs even when the low potential is supplied after the high potential and the intermediate potential have been supplied.

BRIEF DESCRIPTION OF THE DRAWINGS

The above and other objects, features and advantages of the present invention will be apparent from the following description of preferred embodiments according to the invention explained with reference to the accompanying drawings, in which:

FIG. 1 is a diagrammatic sectional view of a complementary type semiconductor integrated circuit as a first embodiment according to the present invention;

FIG. 2 is a diagrammatic sectional view of a complementary type semiconductor integrated circuit as a second embodiment according to the present invention.

PREFERRED EMBODIMENTS OF THE INVENTION

Throughout the following explanation, similar reference symbols or numerals refer to the same or similar elements in all figures of the drawings.

For the purpose of assisting in the understanding of the present invention, a conventional complementary type semiconductor integrated circuit device will first be described with reference to FIGS. 3(a) and 3(b).

Figure 3A:
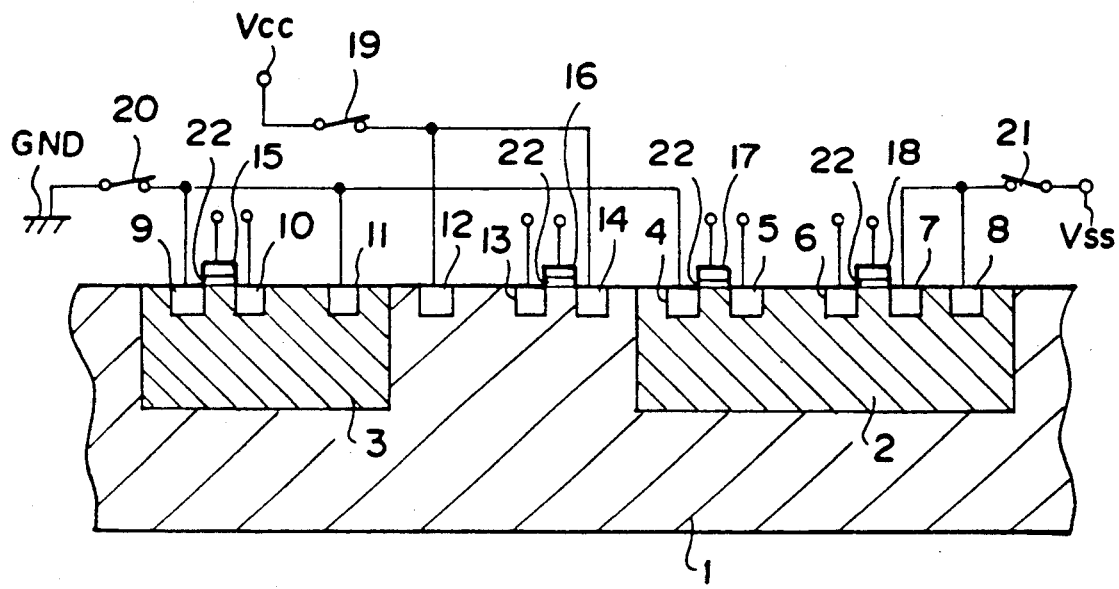
FIGS. 3(a) and 3(b) are diagrammatic sectional views of a conventional complementary type semiconductor integrated circuit.
Figure 3B:
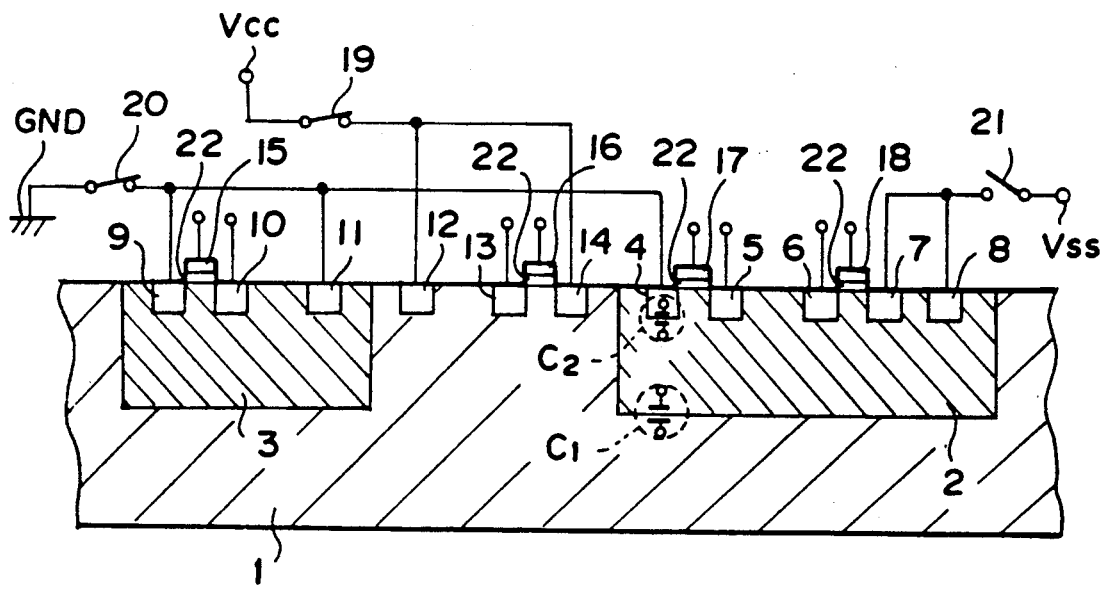

FIGS. 3(a) and 3(b) diagrammatically show in sectional views the conventional P-well and complementary type semiconductor integrated circuit device.

As shown in FIG. 3(a), P-type wells 2, 3 which are isolated from each other are selectively formed on the surface of an N-type semiconductor substrate 1.

On the surface of the P-type well 2 are selectively formed $N^-$ type diffusion regions 4 through 7 and $P^+$ type diffusion region 8 which are isolated from one another. On the P-type well 2, between the $N^-$ diffusion regions 4 and 5, a gate electrode 17 is selectively formed with a gate oxide layer 22 being interposed. Also, on the P-type well 2, between the $N^-$ diffusion regions 6 and 7, a gate electrode 18 is selectively formed with a gate oxide layer 22 being interposed.

On the surface of the P-type well 3 are selectively formed $N^-$ type diffusion regions 9 and 10 and a $P^-$ type diffusion region 11 which are isolated from one another. On the P-type well 3, between the $N^-$ type diffusion regions 9 and 10, a gate electrode 15 is selectively formed with a gate oxide layer 22 being interposed.

On the surface of the N-type semiconductor substrate 1, between the P-type wells 2 and 3, an $N^-$ type diffusion region 12 and $P^-$ type diffusion regions 13, 14 which are isolated from one another are selectively formed. On the N-type semiconductor substrate 1, between the $P^-$ type diffusion regions 13 and 14, a gate electrode 16 is selectively formed with a gate oxide layer 22 being interposed.

In such conventional complementary type semiconductor integrated circuit as arranged above, generally there exists a thyristor configuration formed parasitically so that, if a thyristor loop is actuated or triggered by any causes, a large amount of current continues to flow in the circuit thereby possibly causing metal wirings such as of aluminum to be melted and cut with the P-N junction being destructed and the integrated circuit damaged. This phenomenon is called a "latch-up" and is an extremely great drawback in an complementary type semiconductor integrated circuit. Generally and often times the latch-up is caused by an external noise as a trigger when it enters input or output pins of the integrated circuit.

Conventionally there have been proposed various attempts to prevent the occurrence of the latch-up caused by external noises.

However, in the above-described conventional complementary type semiconductor integrated circuit device in which three kinds of potentials are supplied externally, the latch-up can be caused not only by an external noise but also by the sequences in which the three kinds of potentials are supplied.

For example, where there are, as the three kinds of potentials, a high potential ($V_{cc}$), an intermediate potential (GND) and a low potential ($V_{ss}$), there may be the following three different sequences in which the power is supplied.

(1) GND and $V_{cc}$ are supplied followed by $V_{ss}$;
(2) GND and $V_{ss}$ are supplied followed by $V_{cc}$; and
(3) $V_{ss}$ and $V_{cc}$ are supplied followed by GND.

Amongst the above three sequences, the probability of the occurrence of latch-up is high in the above first (1).

Now, how the latch-up develops in the above (1) is explained with reference to FIGS. 3(a) and 3(b).

First, as shown in FIG. 3(a), the potential $V_{cc}$ (positive potential) is supplied to the $N^-$ type diffusion region 12 and the $P^-$ type diffusion region 14 through a switch 19. The potential GND (ground potential) is supplied to the $N^-$ type diffusion regions 4, 9 and the $P^-$ type diffusion region 11 through a switch 20. The potential $V_{ss}$ (negative potential) is supplied to the $N^-$ type diffusion region 7 and the $P^-$ type diffusion region 8 through a switch 21. Appropriate or predetermined wirings are connected to the $N^-$ type diffusion regions 5, 6 and 10, the $P^-$ type diffusion region 13 and the gate electrodes 15 through 18.

In the complementary type semiconductor integrated circuit device with the respective potentials being supplied as above, the potential of the N-type semiconductor substrate 1 is fixed to $V_{cc}$ through the $N^-$ type diffusion region 12. The potential of the P-type well 2 is fixed to $V_{ss}$ through the $P^-$ type diffusion region 8. The potential of the P-type well 3 is fixed to GND through the $P^-$ type diffusion region 11.

Further, the $P^-$ type diffusion region 14 functions as a source of a P-channel MOS transistor formed on the surface of the N-type semiconductor substrate 1. The $N^-$ type diffusion region 7 functions as a source of the N-channel MOS transistor formed on the surface of the P-type well 2. The $N^-$ type diffusion region 9 functions as a source of the N-channel MOS transistor formed on the surface of the P-type well 3. The $N^-$ type diffusion region 4 functions as a drain of the N-channel MOS transistor formed on the surface of the P-type well 2.

Next, as shown in FIG. 3(b), the switch 21 is turned to an OFF state. That is, as in the above state (1), the state is that in which the potentials of GND and $V_{cc}$ are supplied but the potential of $V_{ss}$ is not supplied. Here, the P-type well 2 is in its floating state since it is not connected to the fixed potential ($V_{ss}$) through the P-type diffusion region 8 and the potential of the P-type well 2 becomes an intermediate potential between the potentials of GND and $V_{cc}$.

The value of the intermediate potential of the P-type well 2 is determined by the capacitance ratio of a capacitance $C_1$ of the P-N junction and a capacitance $C_2$ of the P-$N^+$ junction, the capacitance $C_1$ being disposed between the N-type semiconductor substrate 1 fixed to $V_{cc}$ and the P-type well 2 and the capacitance $C_2$ being disposed between $N^+$ type diffusion region 4 fixed to GND and the P-type well 2.

Thus, under this state, when the potential of the P-type well 2 becomes higher than the built-in potential of a P-$N^-$ junction diode formed by the P-type well 2 and the $N^-$ type diffusion region 4, a large amount of electrons flow from the $N^-$ type diffusion region 4 into the P-type well 2 and these electrons acting as triggers cause the occurrence of latch-up between $V_{cc}$ and GND.

Therefore, in the conventional complementary type semiconductor integrated circuit device of the kind explained above, various means are provided to fix the sequences in which the power is supplied and this results in placing restrictions in the usages of the device.

In view of the above problems in the conventional devices of the kind explained above, the present invention aims at providing an improved complementary type semiconductor integrated circuit device in which the latch-up is prevented from occurring even when the low potential is supplied after the high and intermediate potentials have been supplied.

According to the present invention, when the high and intermediate potentials are respectively supplied to the high potential and intermediate potential input terminals without the low potential being supplied to the low potential input terminal, that is, when the semiconductor substrate is fixed to the high potential and the second diffusion region is fixed to the intermediate potential, the potential of the well is determined by the capacitance ratios among the junction capacitance between the semiconductor substrate and the well, the junction capacitance between the second diffusion region and the well and the capacitance of the capacitor connected between the intermediate potential input terminal and the low potential input terminal. Therefore, by increasing the capacitance of the capacitor to a value larger than the junction capacitance between the semiconductor substrate and the well, it is possible to lower the potential of the well whereby the flow of electrons from the second diffusion region to the well can be prevented.

Therefore, in the integrated circuit device according to the present invention, the latch-up is prevented from occurring even when the low potential is supplied after the high and the intermediate potential have been supplied. Further, at the time when the low potential is supplied to the low potential input terminal or under the state in which the respective potentials are being supplied to all the input terminals, the means or a latch-up protective circuit for preventing the latch-up does not have any adverse influence on other circuits.

Now, some preferred embodiments according to the present invention are explained with reference to the appended drawings.

FIG. 1 diagrammatically shows a complementary type semiconductor integrated circuit device as a first embodiment according to the present invention. The same or like reference numerals or symbols as used in FIGS. 3(a) and 3(b) are used in FIG. 1 and the explanation for the same or like elements is omitted herein.

As shown in FIG. 1, the potential $V_{cc}$ (+5 V) is supplied to the $N^+$ type diffusion region 12 and the $P^+$ type diffusion region 14 through the switch 19. The potential GND (0 V) is supplied to the $N^+$ type diffusion regions 4, 9 and $P^+$ type diffusion region 11 through the switch 20. The potential $V_{ss}$ (−5 V) is supplied to the $N^+$ type diffusion region 7 and $P^+$ type diffusion region 8 through the switch 21. An external capacitance $C_3$ is connected between GND and $V_{ss}$.

In the complementary type semiconductor integrated circuit device as arranged above, when the switches 19 and 20 are turned ON and the switch 21 is turned OFF, the potentials GND and $V_{cc}$ are supplied by the potential $V_{ss}$ is not supplied. Consequently, the P-type well 2 will be in a floating state and the potential of the P-type well 2 will become an intermediate potential between the potentials GND and $V_{cc}$. The values of this intermediate potential of the P-type well 2 is determined by the capacitance ratios among the capacitance $C_1$ of the P-N junction between the N-type semiconductor substrate 1 fixed to $V_{cc}$ and the P-type well 2, the capacitance $C_2$ of the P-N+ junction between the N− type diffusion region 4 fixed to GND and the P-type well 2 and the external capacitance $C_3$ connected between the GND and $V_{ss}$.

In this instance, if the value of the external capacitance $C_3$ is set to a value, for example, 10 times that of the junction capacitance $C_1$, the potential of the P-type well 2 will be, due to the capacitance ratios, approximately 0.45 V which is 1/11 of $V_{cc}$ (+5 V). Consequently, the voltage across the N− type diffusion region 4 and the P-type well 2 will be approximately 0.45 V. Under the voltage of this order, the electrons do not flow from the N− − type diffusion region 4 to the P-type well 2 and the occurrence of latch-up is effectively prevented.

Further, even when the switch 21 is turned ON subsequently and the potential $V_{ss}$ is supplied, the external capacitor $C_3$ has no influence on the complementary type semiconductor integrated circuit device.

FIG. 2 diagrammatically shows in a sectional view a complementary type semiconductor integrated circuit device as a second embodiment according to the present invention, the same or like reference numerals and symbols for the same of like elements in FIG. 1 are used in FIG. 2 and the same explanation therefor has been omitted.

In this embodiment, instead of the external capacitor $C_3$ provided in the circuit of the first embodiment, there is provided an internal capacitor $C_4$ formed on the surface of the P-type well 2 and between the potentials GND and $V_{ss}$. Thus, as is the case with the external capacitor $C_3$, by setting the value of the internal capacitor $C_4$ to a value larger than that of the junction capacitor $C_1$, it is possible to prevent the occurrence of a latch up in the same way as in the circuit of the first embodiment.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A complementary type semiconductor integrated circuit device adapted to be connected to a high potential input terminal, a low potential input terminal and and intermediate potential input terminal, said circuit device comprising:
    a semiconductor substrate of a first conductivity type connected to said high potential input terminal;
    a first well region of a second conductivity type formed selectively on a surface of said semiconductor substrate and connected to said intermediate potential input terminal;
    a second well region of said second conductivity type formed selectively on a surface of said semiconductor substrate and connected to said low potential input terminal;
    a diffusion region of said first conductivity type formed selectively on a surface of said second well region and connected to said intermediate potential input terminal; and
    a capacitor interconnecting said intermediate potential input terminal and said low potential input terminal, the capacitance of said capacitor being of a value larger than that existing between said high potential input terminal and said intermediate potential input terminal.

2. A complementary type semiconductor integrated circuit device according to claim 1, in which said first conductivity type in an N-type and said second conductivity type is a P-type.

3. A complementary type semiconductor integrated circuit device adapted to be connected to a high potential input terminal, a low potential input terminal and an intermediate potential input terminal, said circuit device comprising:
    a semiconductor substrate of a first conductivity type connected to said high potential input terminal;
    a first well region of a second conductivity type formed selectively on a surface of said semiconductor substrate and connected to said intermediate potential input terminal;
    a second well region of said second conductivity type formed selectively on a surface of said semiconductor substrate and connected to said low potential input terminal;
    a diffusion region of said first conductivity type formed selectively on a surface of said second well region and connected to said intermediate potential input terminal; and
    a capacitor formed on a surface of said second well region and being disposed between said intermediate potential input terminal and said second well region, the capacitance of said capacitor being of a value larger than that existing between said high potential input terminal and said intermediate potential input terminal.

4. A complementary type semiconductor integrated circuit device adatped to be connected to a high potential input terminal, a low potential input terminal and an intermediate potential input terminal, said circuit device comprising:
    a semiconductor substrate of a first conductivity type connected to said high potential input terminal;
    a first well region of a second conductivity type formed selectively on a surface of said semiconductor substrate and connected to said intermediate potential input terminal;
    a second well region of said second conductivity type formed selectively on a surface of said semiconductor substrate and connected to said low potential input terminal;
    a diffusion region of said first conductivity type formed selectively on a surface of said second well region and connected to said intermediate potential input terminal; and
    a capacitor interconnecting said itermediate potential input terminal and said low potential input terminal, the capacitance of said capacitor being of a value larger than that existing between said potential input terminal and said intermediate potential input terminal so as to prevent electrons from flowing from the diffusion region to the second well region and thereby avoid occurrence of a latch-up in the integrated circuit when a low potential is supplied to the circuit after a high and an intermediate potential have been supplied thereto.

5. A complementary type semiconductor integrated circuit device according to claim 4, in which said first conductivity type is an N-type and said second conductivity type is a P-type.

6. A complementary type semiconductor integrated circuit device according to claim 4, in which said capacitor is connected to said diffusion region.

7. A complementary type semiconductor integrated circuit device adapted to be connected to a high potential input terminal, a low potential input terminal and an intermediate potential input terminal, said circuit device comprising:
- a semiconductor substrate of a first conductivity type connected to said high potential input terminal;
- a first well region of a said second conductivity type formed selectively on a surface of said semiconductor substrate and connected to said intermediate potential input terminal;
- a second well region of said second conductivity type formed selectively on a surface of said semiconductor substrate and connected to said low potential input terminal;
- a diffusion region of said first conductivity type formed selectively on a surface of said second well region and connected to said intermediate potential input terminal; and
- a capacitor formed on a surface of said second well region and being disposed between said intermediate potential input terminal and said second well region, the capacitance of said capacitor being of a value larger than that existing between said high potential input terminal and said intermediate potential input terminal so as to prevent occurrence of a latch-up in the integrated circuit when a low potential is supplied to the circuit after a high and an intermediate potential have been supplied thereto.

8. A complementary type semiconductor integrated circuit device according to claim 7, in which said first conductivity type is an N-type and said second conductivity type is a P-type.

9. A complementary type semiconductor integrated circuit device according to claim 7, in which said capacitor further is connected to said diffusion region.

10. A complementary type semiconductor integrated circuit device according to claim 3, in which said first conductivity type is an N-type and said second conductivity type is a P-type.

* * * * *